United States Patent [19]
Ondricek et al.

[11] Patent Number: 5,883,788
[45] Date of Patent: *Mar. 16, 1999

[54] BACKING PLATE FOR LGA MOUNTING OF INTEGRATED CIRCUITS FACILITATES PROBING OF THE IC'S PINS

[75] Inventors: Douglas S. Ondricek, Dallas; Terrel L. Morris, Garland; Eric C. Peterson, Allen, all of Tex.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 741,649

[22] Filed: Oct. 31, 1996

[51] Int. Cl.$^6$ .................................. H05K 7/12; H01R 9/09
[52] U.S. Cl. ......................... 361/768; 361/767; 439/71; 439/73; 439/331
[58] Field of Search .................... 174/52.1, 52.4; 206/710, 711, 722, 724, 751, 752; 257/678, 718, 719, 723, 726, 727; 361/704, 707, 713, 715, 717, 718, 760, 767, 768, 769, 770, 771, 807, 744, 735, 790, 808, 809, 810, 820; 439/68, 69, 66, 70, 71, 73, 74, 80, 82, 83, 327, 330, 331, 366, 525, 526, 591, 91

[56] References Cited

U.S. PATENT DOCUMENTS

| | | | |
|---|---|---|---|
| 5,215,472 | 6/1993 | Delprete et al. | 439/71 |
| 5,702,255 | 12/1997 | Murphy et al. | 439/71 |
| 5,738,531 | 4/1998 | Beaman et a l. | 439/71 |
| 5,833,471 | 11/1998 | Selna | 439/73 |
| 5,834,335 | 11/1998 | Buschbom | 438/107 |

*Primary Examiner*—Donald Sparks
*Attorney, Agent, or Firm*—Edward L. Miller

[57] ABSTRACT

A backing plate facilitates electrical probing of VLSI IC signals in an array of signal via pads on the back side of a printed circuit board and which correspond to an LGA of socket pads on the front side of the printed circuit board. The backing plate is constructed of electrically non conductive mechanically stiff material that already has drilled therein a hole for each signal via pad that might be probed. Polyamide is a suitable material for such a backing plate. Special symbols, legends and suitable grid identification axes can be silk screened onto the side of the backing plate that remains visible when installed. The drilled insulative backing plate can be equipped with captive threaded studs, if desired. Alternatively, it may simply have holes to receive fasteners, or have captive female threaded fasteners in lieu of holes.

4 Claims, 2 Drawing Sheets

BACKING PLATE FOR LGA MOUNTING OF INTEGRATED CIRCUITS FACILITATES PROBING OF THE IC'S PINS

BACKGROUND OF THE INVENTION

Very large scale integration (VLSI) integrated circuits (IC's) such as big gate arrays or application specific IC's (ASIC's) may have a large number of signals that need to enter or leave the IC by "signal pins": several hundred to over one thousand. These IC's are commonly mounted to printed circuit boards (PCB's). The manner of mounting may include either soldering or the use of sockets.

By the term "socket" we refer to any of a variety of commercially available high density low inductance LGA sockets supplied by various manufacturers. One such socket uses an array of compressible small "fuzz buttons" or "brillo pads". (Brillo is a brand of steel wool balls or pads, used for cleaning, as in scouring pots and pans in a kitchen.) Each of these balls is a small irregularly wound and inter-twined ball of gold wire. These balls of tangled wire are stuffed through a regular array of holes in a thin sheet of insulative material. The regular array of holes matches the pin out pattern on the IC and the PCB, and registration is achieved by alignment pins (dowel pins). The balls of tangled of wire are compressed between the pads (lands) on the PCB and the corresponding pads or lands (signal pins) on the underside of the IC. Through such compression the fuzzy balls of wire become intervening series connections between the pads on the PCB and those on the IC. If such a socket is used the array of pads is referred to as a land grid array (LGA). To avoid any possibility of confusion in the description that follows, we shall henceforth refer to an "LGA of socket pads" when referring to those lands on the PCB that mate with an LGA socket. There is an industry standard describing what an LGA of socket pads is to look like. If an LGA socket is not used and the part is simply soldered to the PCB, the array is referred to as a ball grid array (BGA).

From the description above it is clear that use of a socket for an LGA requires sufficient compressive force to adequately squeeze all the fuzzy wire balls in the socket against the LGA of socket pads and against the signal pins of the IC. The force required can be significant, and for an IC having eight or nine hundred signal pins it may take four stout screws or small bolts to achieve the requisite force. A companion issue quickly arises. Even though the mother board may be a multi-layer PCB, just a few thousandths of an inch deformation within the region of the LGA can be enough to introduce connectivity problems. Even a multi-layer PCB is typically not stiff enough to sufficiently resist deformation, especially at elevated temperatures. The usual solution for dealing with this issue is to supply a suitably stiff backing plate, or bolster, on the opposite side of the PCB, and then use the screws to compress both the socket and the mother board between the backing plate and the IC. Painted 3/16" aluminum plate with attached threaded studs is a favorite choice for backing plates.

It should not be assumed that backing plates are needed for only LGA sockets of the fuzzy ball type. Other types of LGA sockets can require the use of backing plates, as well.

One last bit of background deserves attention. Consider the various many signals that go to and from the IC. The vast majority of them are traces on planes (layers) located in the interior of the PCB. To get to the LGA of socket pads on an outside surface they must travel by via's, which start out as holes drilled in the PCB. The most common manufacturing technique is for these holes to go all the way through the board and generate a corresponding pattern of signal vias and their pads on the "back side" of the PCB, away from the IC and next to the backing plate. The pads in this pattern might be the same as for LGA socket pads, or they might be the round land typically associated with an ordinary via. Either way, we shall henceforth refer to these pads on the backside of the PCB as an array or pattern of "signal via pads".

There are several reasons for having the holes for the vias under the LGA of socket pads go all the way through the PCB. Among these is that it facilitates reliable formation of the plating that forms the via. (There are blind hole processes, however. If one of these were used there would be no pattern of signal via pads on the back side of the PCB.) Another reason is that during development standard solid backing plates will sometimes have a small portion removed to allow probing of the IC's signals (as with an oscilloscope probe or probes for a logic or timing analyzer) from the back side of the PCB. These modified backing plates are generally made up on demand, and are best thought of as special tooling. Such probing could not be done if there were no signal via pads on the back side. A coat of enamel paint baked onto the aluminum is often relied upon to provide electrical insulation between the signal via pads on the backside and the conductive aluminum interior of the backing plate. Modification of the backing plate exposes the aluminum. Even if insulation is replaced, probe tips are generally sharp, and in time the possibility of an inadvertent short circuit to the baking plate (whether involving the probe tip or not) cannot be discounted. Certain such short circuits, however brief in duration, could be very damaging.

Even if a modified backing plate is available during a trouble shooting episode, it is a disagreeable task to remove the existing one and replace it with the special one. Aside from the effort, and the wear and tear on the PCB and the IC, there is the uncertainty introduced by the disturbance of disassembly and re-assembly. (Was there a bad connection that is now gone, or is there now a different bad connection, or, was it OK and now it is not?) It would be desirable if the backing plate used for production purposes in the first instance, and shipped as part of the product, were such that it facilitated probing of the IC's signals at the signal via pads, and that home made modified backing plates were thus not necessary.

SUMMARY OF THE INVENTION

A solution to the problem of probing a VLSI IC's signals as they appear at the signal via pads on the back side of the PCB is to use a backing plate constructed of electrically non conductive mechanically stiff material and that already has drilled therein a hole for each signal via pad that might be probed. For one backing plate of polyamide whose overall dimensions are 2.375 in. by 2.0 in. and having approximately eight hundred 0.030 in. holes therein, a thickness of 0.125 in. was found to be sufficient. Special symbols, legends and suitable grid identification axes can be silk screened onto the side of the backing plate that remains visible when installed. The drilled insulative backing plate can be equipped with captive threaded studs, if desired. Alternatively, it may simply have holes to receive fasteners, or have captive female threaded fasteners in lieu of holes.

DESCRIPTION OF A PREFERRED EMBODIMENT

Figure 1:
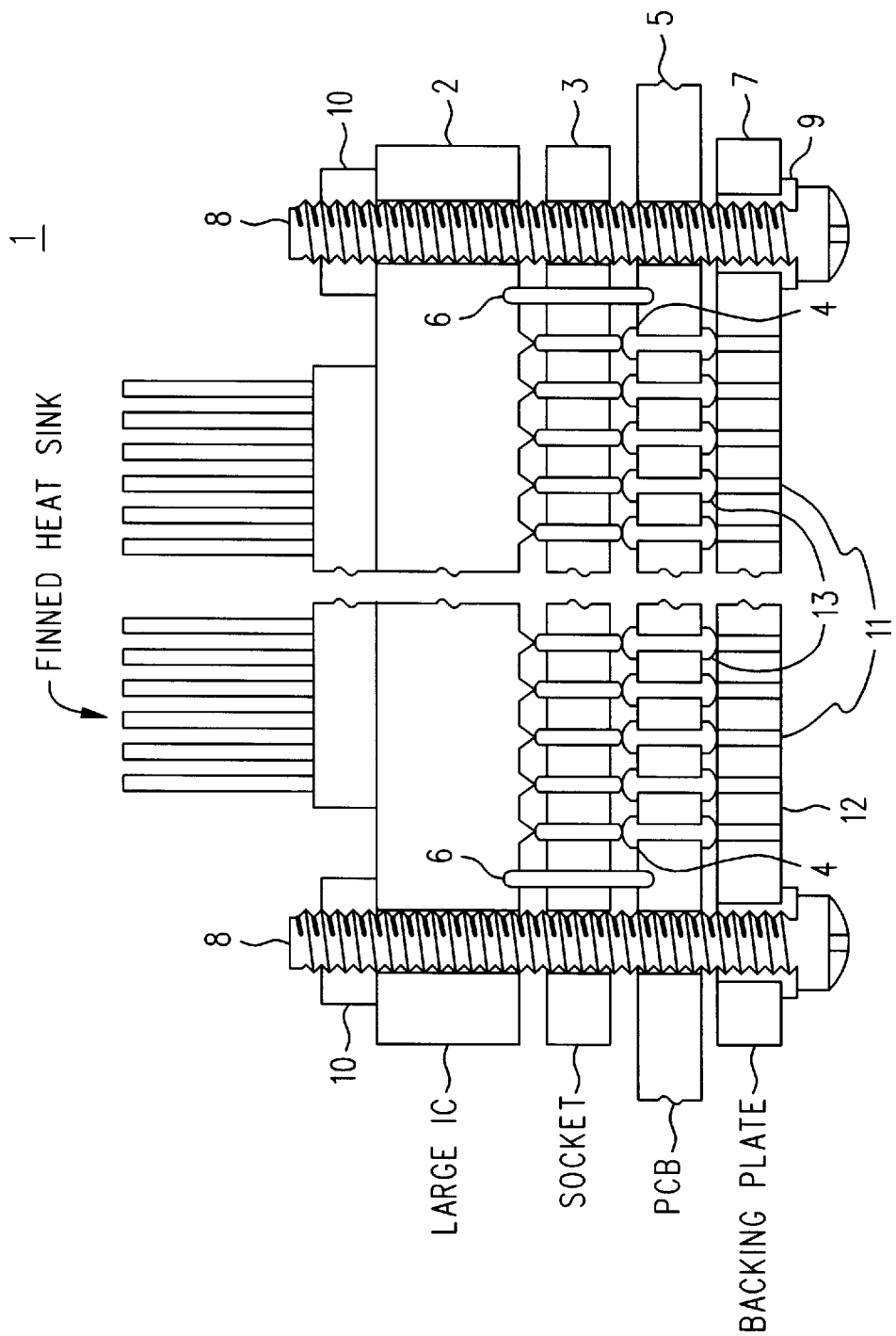
FIG. 1 is a simplified cross sectional view of a VLSI ASIC mounted with a socket to a land grid array on a printed circuit board with the aid of a backing plate that facilitates probing the signals of the ASIC as they appear at signal via pads on the backside of the printed circuit board.

Refer now to FIG. 1, wherein is shown a cross sectional view 1 of a VLSI ASIC or other large IC 2 mounted by a fuzzy ball socket 3 to an LGA of socket pads 4 on a printed circuit board 5. Alignment pins 6 (dowel pins) ensure registration of the socket 3 between the IC and the PCB. To prevent warping or distortion of the PCB that might easily arise from the compressive force needed to ensure good contact for all the various connections (which might be over one thousand signal pins), an insulative backing plate 7 adds stiffness to the PCB 5 in the region of the LGA 4. Screws 8 provide the compressive force needed to produce reliable electrical connection. In the example shown in the figure the backing plate 7 includes threaded pressed-in inserts 9 to make the screws 8 captive. This is optional, as the inserts 9 could serve as captive nuts for screws whose heads bear against the IC 2. The threaded inserts 9 could be entirely absent, if desired. Also in the present example are nuts 10 that cooperate with the heads of the screws 8 to actually provide the compressive force. This is only one of many ways that the fastening of the IC 2, socket 3 and backing plate 7 to the PCB 5 might be accomplished.

Note that the LGA of socket pads 4 extends by vias through to signal via pads 13 on the other (non IC) side of the PCB 5. Note also that the backing plate 7 has a corresponding array of holes 11 therein. These holes 11 are aligned with the signal via pads 13. Each of the holes 11 is of a diameter sufficient to allow a suitable probe to pass therethrough. Since the backing plate is of an insulative material, there is no worry of inappropriate short circuits.

The backing plate 7 may be of polyamide, one eighth of an inch in thickness, with probe holes of 0.030 inches in diameter.

Figure 2:
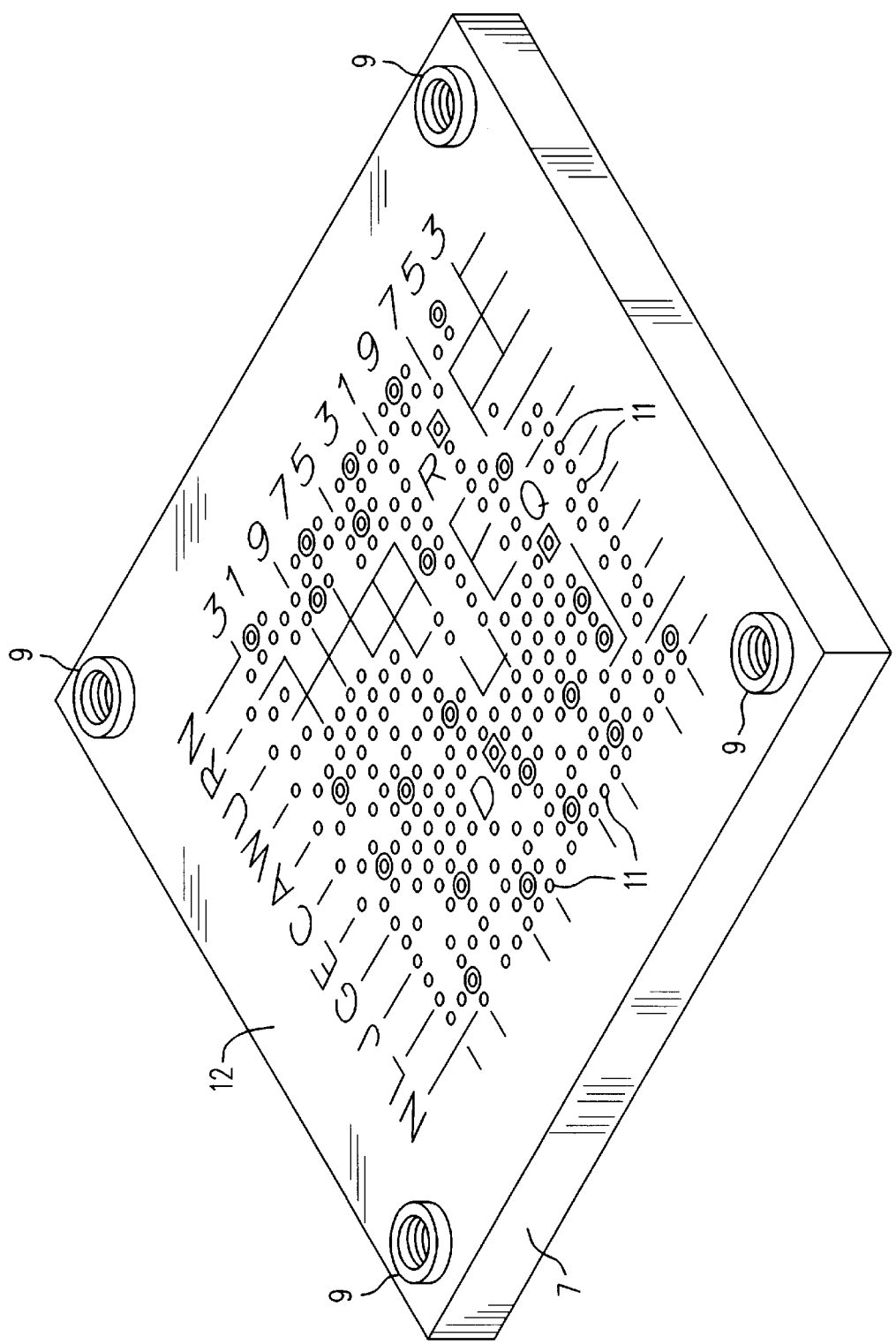
FIG. 2 is perspective view of the backing plate of FIG. 1.

Refer now to FIG. 2, which is a perspective view of the "back side" 12 of the backing plate 7. The small circles are the probe holes 11. Various useful indicia may be silk screened or otherwise printed onto the back side 12 of the backing plate 7. These may include an axis or grid system for identifying any signal pin position potentially of interest in the LGA, special symbols to allow quick identification of certain signals of interest, such as power supplies, ground and clocks, as well as identifiers of the particular instance or type IC associated with the backing plate 7 (such a legend is not shown in the figure).

We claim:

1. Apparatus for mounting an integrated circuit onto a printed circuit board having a land grid array on a first side of the printed circuit board and a corresponding pattern of signal via pads on the an opposite side, the apparatus comprising:

a backing plate of insulative material;

a plurality of fasteners that both register the position of the backing plate relative to the integrated circuit and produce a compressive force urging the integrated circuit in a first direction toward the first side of the printed circuit board and urging the backing plate against the opposite side of the printed circuit board in a direction opposite the first direction; and a plurality of individual holes in the backing plate that are in respective alignment with individual signal via pads when the backing plate is registered by the plurality of fasteners.

2. Apparatus as in claim 1 wherein the insulative material is polyamide.

3. Apparatus as in claim 1 wherein the side of the backing plate visible when installed bears indicia identifying signal pin positions in the land grid array.

4. Apparatus as in claim 1 wherein the plurality of fasteners is of threaded fasteners and further comprising a first corresponding plurality of holes in the backing plate and a second corresponding plurality of holes in the printed circuit board, through which corresponding pluralities the threaded fasteners pass.

* * * * *